(12) United States Patent
Worledge

(10) Patent No.: US 8,233,249 B2
(45) Date of Patent: Jul. 31, 2012

(54) MAGNETIC TUNNEL JUNCTION TRANSISTOR DEVICE

(75) Inventor: Daniel C. Worledge, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 382 days.

(21) Appl. No.: 12/651,804

(22) Filed: Jan. 4, 2010

(65) Prior Publication Data

US 2011/0164338 A1  Jul. 7, 2011

(51) Int. Cl.
*G11B 5/39* (2006.01)
(52) U.S. Cl. ............... 360/324.2; 360/314; 257/295; 257/421
(58) Field of Classification Search ........... 360/324.2, 360/314; 257/295, 421, E27.006, E27.104
See application file for complete search history.

(56) References Cited

U.S. PATENT DOCUMENTS

| | | | |
|---|---|---|---|
| 5,654,566 A * | 8/1997 | Johnson | 257/295 |
| 6,480,365 B1 | 11/2002 | Gill et al. | |
| 6,593,608 B1 | 7/2003 | Sharma et al. | |
| 6,784,509 B2 | 8/2004 | Yuasa et al. | |
| 7,009,903 B2 | 3/2006 | Perner et al. | |
| 7,027,268 B1 * | 4/2006 | Zhu et al. | 360/314 |
| 7,268,982 B2 | 9/2007 | Gill | |
| 7,268,986 B2 | 9/2007 | Gill | |
| 7,488,609 B1 | 2/2009 | Lin et al. | |
| 7,583,481 B2 | 9/2009 | Zhang et al. | |
| 7,750,390 B2 * | 7/2010 | Saito et al. | 257/314 |
| 7,897,274 B2 | 3/2011 | Yuasa et al. | |
| 7,948,044 B2 * | 5/2011 | Horng et al. | 257/421 |
| 2002/0064004 A1 * | 5/2002 | Worledge | 360/324.2 |
| 2004/0061983 A1 | 4/2004 | Childress et al. | |
| 2007/0086121 A1 | 4/2007 | Nagase et al. | |
| 2007/0297220 A1 * | 12/2007 | Yoshikawa et al. | 365/158 |
| 2008/0179699 A1 | 7/2008 | Horng et al. | |
| 2008/0231998 A1 | 9/2008 | Yoshikawa et al. | |
| 2009/0067232 A1 | 3/2009 | Korenivski | |
| 2009/0108383 A1 | 4/2009 | Horng et al. | |
| 2009/0122450 A1 | 5/2009 | Wang et al. | |
| 2010/0072529 A1 * | 3/2010 | Marukame et al. | 257/295 |
| 2010/0177449 A1 | 7/2010 | Zhao et al. | |
| 2010/0316890 A1 | 12/2010 | Choi et al. | |
| 2012/0026785 A1 * | 2/2012 | Ranjan et al. | 365/158 |

OTHER PUBLICATIONS

Chih-Ta Shen et al. "Improvement of Transport Properties in Magnetic Tunneling Junctions by Capping Materials," IEEE Transactions on Magnetics; Jun. 2007, pp. 2785-2787, vol. 43, No. 6, IEEE.

(Continued)

*Primary Examiner* — Will J Klimowicz
(74) *Attorney, Agent, or Firm* — Cantor Colburn LLP; Vazken Alexanian

(57) ABSTRACT

A magnetic tunnel junction transistor (MTJT) device includes a source-drain region comprising a source electrode and a drain electrode, a double MTJ element formed between the source electrode and the drain electrode and comprising a free magnetic layer at a center region thereof, and a gate region adjacent to the source-drain region and comprising an insulating barrier layer formed on an upper layer of the double MTJ element and a gate electrode formed on the insulating barrier layer. The MTJT device switches a magnetization orientation of the free magnetic layer by application of a gate voltage to the gate electrode, thereby changing a resistance of the source-drain region.

23 Claims, 2 Drawing Sheets

OTHER PUBLICATIONS

Masahiko Nakayama et al., "Spin transfer switching in TbCoFe/CoFeB/MgO/CoFeB/TbCoFe magnetic tunnel junctions with perpendicular magnetic anisotropy," 2008 American Institute of Physics; Journal of Applied Physics 103, 07A710; (2008); pp. 07A710-1-071710-3.

S. Ikeda et al., "Tunnel magnetoresistance of 604% at 300 K by suppression of Ta diffusion in CoFeB/MgO/CoFeB pseudo-spin-valves annealed at high temperature"; Applied Physics Letters 93, 082508 (2008) pp. 1-3.

Lizian Jiang et al., "Large Tunnel Magnetoresistance of 1056% at Room Temperature in MgO Based Double Barrier Magnetic Tunnel Junction"; Applied Physics Express 2 (2009) 083002; pp. 1-3.

W. J. Gallagher et al., "Development of the magnetic tunnel junction MRAM at IBM: From first junctions to a 16-Mb MRAM demonstrator chip"; IBM J. RES. & DEV. vol. 50 No. 1 Jan. 2006; pp. 1-19.

T. Maruyama et al., "Large voltage-induced magnetic anisotropy change in a few atomic layers of iron", Letters Published Online: Jan. 18, 2009/ DOI: 10.1038/NNAN0.2008.406; pp. 158-161.

* cited by examiner

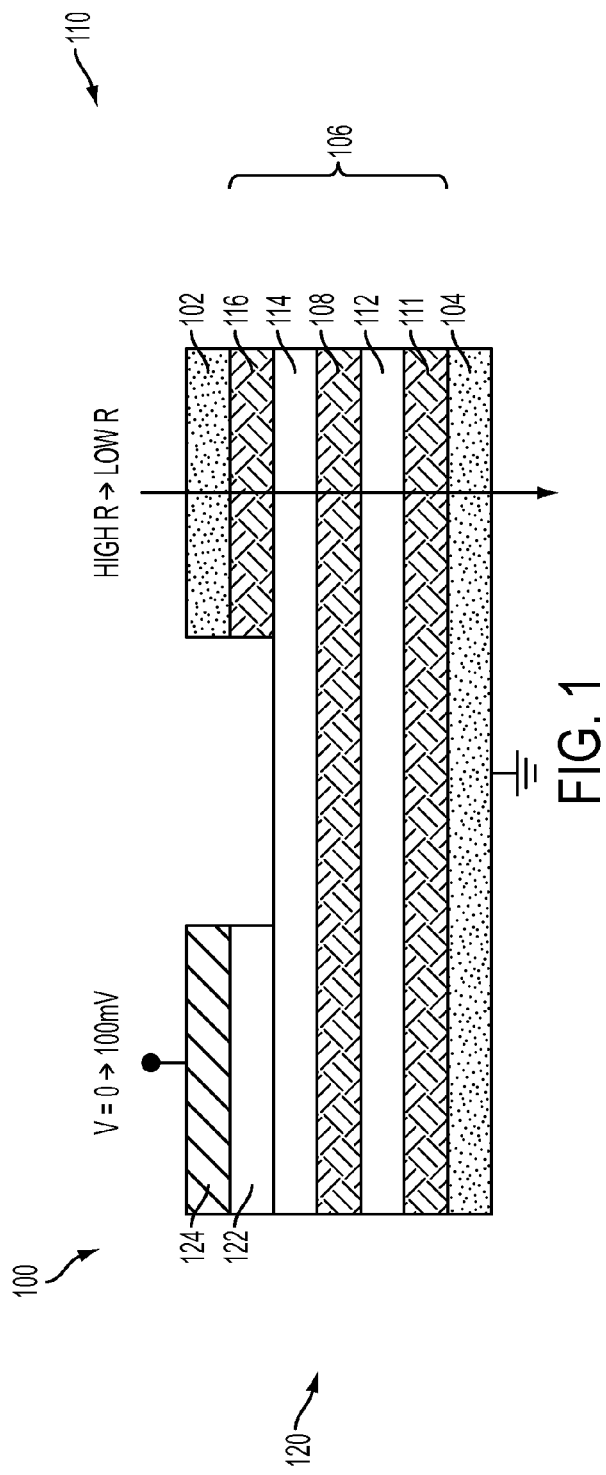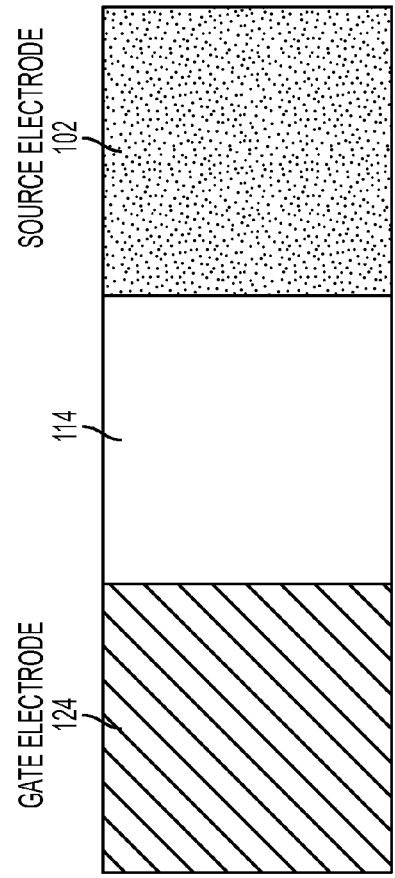

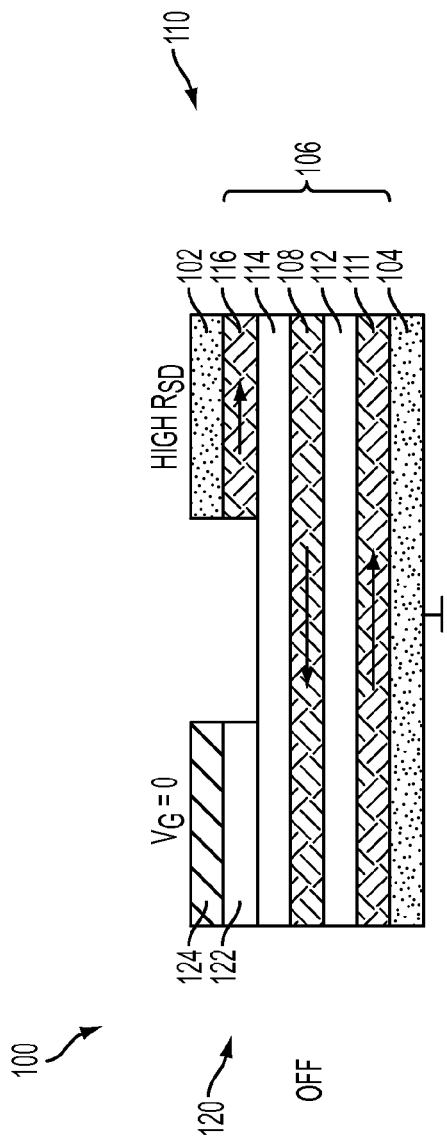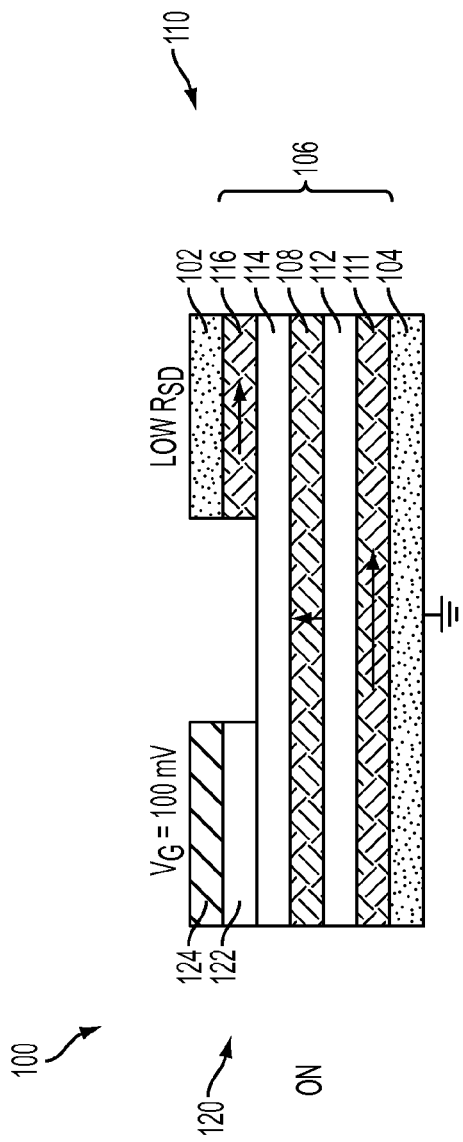

MAGNETIC TUNNEL JUNCTION TRANSISTOR DEVICE

BACKGROUND

The present invention relates generally to logic devices and more specifically, to magnetic tunnel junction transistor (MTJT) devices.

A single MTJ device includes a pinned layer, a tunnel barrier layer and a free layer. The magnetization of the pinned layer is fixed in a direction and the resistance of the device depends on the relative orientation of the magnetizations of the free layer and the pinned layers. Recent developments include the use of magnesium oxide (MgO) based magnetic tunnel junction layers. In contrast to a single MTJ element, a double MTJ device includes two tunnel barrier layers and at least two magnetic layers including a thin middle free magnetic layer and at least one outer magnetic layer. The double MTJ device resistance depends on the relative orientation of the magnetization of the middle layer with respect to one or both of the outer layers.

The performance of complementary metal oxide semiconductor (CMOS) devices is currently limited by power dissipation. Reduction of the operating power within a CMOS device is also very limited. Thus, voltage control of magnetism is currently being researched for application to memory and logic devices in an attempt to reduce the operating power necessary.

SUMMARY

According to one embodiment of the present invention, a magnetic tunnel junction transistor device is provided that is a voltage controlled three terminal device including an insulating barrier layer such as an MgO barrier layer formed at a gate region and a double MTJ element formed within the source-drain region, where the insulating barrier layer is used to modify an anisotropy of a free magnetic layer of the double MTJ element. Thus, the device can be switched between an on state and off state by employing the concept of voltage control of magnetism and using a minimal gate voltage therefore resulting in a large on/off current ratio and a high on-current.

According to an embodiment of the present invention, a magnetic tunnel junction transistor (MTJT) device is provided. The MTJT device includes a source-drain region comprising a source electrode and a drain electrode, a double MTJ element formed between the source electrode and the drain electrode and comprising a free magnetic layer at a center region thereof, and a gate region adjacent to the source-drain region and comprising an insulating barrier layer formed on an upper layer of the double MTJ element and a gate electrode formed on the insulating barrier layer. The magnetic tunnel junction transistor device operates by switching a magnetization orientation of the free magnetic layer by application of a gate voltage to the gate electrode. This results in a large resistance change in the double magnetic tunnel junction between the source and drain electrodes.

According to another embodiment of the present invention, a MTJT device is provided. The MTJT device includes three electrical terminals including a source electrode, and a drain electrode and gate electrode, a double MTJ element formed between the source electrode and the drain electrode and comprising a free magnetic layer at a center region thereof, and an insulating barrier layer formed on an upper layer of the double MTJ element contacting the gate electrode. The magnetic tunnel junction transistor device operates by switching a magnetization orientation of the free magnetic layer by application of a gate voltage to the gate electrode. This results in a large resistance change in the double magnetic tunnel junction between the source and drain electrodes.

According to another embodiment of the present invention, a method for forming a MTJT device is provided. The method includes forming a source-drain region comprising a source electrode and a drain electrode, forming a double MTJ element between the source electrode and the drain electrode and comprising a free magnetic layer at a center region thereof, and forming a gate region adjacent to the source-drain region and comprising an insulating barrier layer formed on an upper layer of the double MTJ element and a gate electrode formed on the insulating barrier layer. The magnetization orientation of the free magnetic layer is switched by application of a gate voltage to the gate electrode. This results in a large resistance change in the double magnetic tunnel junction between the source and drain electrodes.

According to another embodiment of the present invention, a method for operating a MTJT device is provided. The MTJT device includes a source electrode, and a drain electrode and gate electrode, a double MTJ element formed between the source electrode and the drain electrode and comprising a free magnetic layer at a center region thereof, and an insulating barrier layer formed on an upper layer of the double MTJ element contacting the gate electrode. The method includes switching a magnetization orientation of the free magnetic layer by application of a gate voltage to the gate electrode. This results in a large resistance change in the double magnetic tunnel junction between the source and drain electrodes.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1 is a diagram illustrating a side view of a magnetic tunnel junction transistor (MTJT) device that can be implemented within embodiments of the present invention.

FIG. 2 is a diagram illustrating a top view of the MTJT device shown in FIG. 1.

FIG. 3 is a diagram illustrating an off state of the MTJT device shown in FIG. 1 that can be implemented within embodiments of the present invention.

FIG. 4 is a diagram illustrating an on state of the MTJT device shown in FIG. 1 that can be implemented within embodiments of the present invention.

DETAILED DESCRIPTION

With reference now to FIG. 1, a magnetic tunnel junction transistor (MTJT) device having three electrical terminals according to an embodiment of the present invention is provided. The MTJT device 100 includes a source-drain region 110 comprising a source electrode 102 and a drain electrode 104. The MTJT device 100 further includes a double MTJ element 106 formed between the source electrode 102 and the drain electrode 104. A free magnetic layer 108 is formed at a center region of the double MTJ element 106.

According to an embodiment of the present invention, the double MTJ element 106 further includes a first pinned layer 111 formed on the drain electrode 104, a first tunnel barrier layer 112 formed on the first pinned layer 111, the free magnetic layer 108 formed on the first tunnel barrier layer 112, a second tunnel barrier layer 114 formed on the free magnetic layer 108, and a second pinned layer 116 formed on the second tunnel barrier layer 114 and contacting the source electrode 102.

According to an embodiment of the present invention, the MTJT device 100 further includes a gate region 120 adjacent to the source-drain region 110 and comprising an insulating barrier layer 122 formed on an upper layer (e.g., the second tunnel barrier layer 114) of the double MTJ element 106 and a gate electrode 124 formed on the insulating barrier layer 122. According to an embodiment of the present invention, the insulating barrier layer 122 may be formed of magnesium oxide (MgO) or any insulating material. The three electrical terminals include the source electrode 102, the drain electrode 104 and the gate electrode 124 which may be formed of tantalum (Ta); however, the present invention is not limited hereto and any suitable electrode material may be used.

Further, according to an embodiment of the present invention, the first and second pinned layers 111 and 116 are formed of a magnetic material including at least one of cobalt (Co) or iron (Fe), or any combination thereof. For example, the first and second pinned layers 111 and 116 may be formed of CoFeB or CoFe. Further, the first and second pinned layers 111 and 116 may be formed of a predetermined thickness ranging from approximately 1 nanometers (nm) to approximately 5 nanometers (nm).

According to an embodiment of the present invention, the insulating barrier layer 122 is formed on the second tunnel barrier layer 114 of the double MTJ element 106. The insulating barrier layer 122 may be formed of a predetermined thickness ranging from approximately 0.5 nanometers (nm) to approximately 2 nanometers (nm). According to an embodiment of the present invention, the combined thickness of layer 122 and layer 114 is more than the thickness of layer 112.

Further, according to an embodiment of the present invention, the insulating barrier 122, and the first and second tunnel barrier layers 112 and 114 are formed of at least one of magnesium oxide (MgO), aluminum oxide (AlO), or titanium oxide (TiO) or any other suitable materials. The first and second tunnel barrier layers 112 and 114 may be formed of a predetermined thickness ranging from approximately 0.5 nanometers (nm) to approximately 2 nanometers (nm).

According to an embodiment of the present invention, the free magnetic layer 108 is formed of iron (Fe) or a magnetic material including at least one of cobalt (Co) or iron (Fe), or any combination thereof. Further, according to an embodiment of the present invention, the free magnetic layer 108 is of a predetermined thickness ranging from approximately 0.3 nanometers (nm) to approximately 1 nanometer (nm). The free magnetic layer 108 is an ultra-thin magnetic layer where the energy levels are quantized into very narrow bands.

FIG. 2 is a diagram illustrating a top view of the MTJT device 100 shown in FIG. 1. The gate electrode 124, a top portion of the second tunnel barrier layer 114 and the source electrode 102 can be seen in FIG. 2, from a top view of the MTJT device 100.

According to an embodiment of the present invention, the MTJT device 100 switches a magnetization orientation of the free magnetic layer 108 by applying a gate voltage to the gate electrode 124. Additional details regarding the operation of the MTJT device 100 will be described below with reference to FIGS. 3 and 4.

FIG. 3 is a diagram illustrating an off state of the MTJT device 100 shown in FIG. 1 that can be implemented within embodiments of the present invention. FIG. 4 is a diagram illustrating an on state of the MTJT device shown in FIG. 1 that can be implemented within embodiments of the present invention.

According to an embodiment of the present invention, the MTJT device 100 switches between an on state and an off state based on the gate voltage applied to the gate electrode 124. According to an embodiment of the present invention, the gate voltage applied to the gate electrode 124 ranges between approximately 0 millivolts (mV) to approximately 100 (mV).

According to an embodiment, the resistance of the double MTJ element 110 is modulated by switching the magnetization orientation of the free magnetic layer 108 between in-plane and perpendicular. By forming the free magnetic layer of a different thickness from that of the first and second pinned layers 111 and 116, the MTJT device 100 may have a normally in-plane and a normally perpendicular magnetization.

During an off state of the MTJT device 100, the magnetization orientation of the free magnetic layer 108 is in plane with a magnetization orientation of the first and second pinned layers 111 and 116 such that a resistance of the source-drain region 110 is in a high resistance state as shown in FIG. 3.

When the gate voltage is applied to the gate electrode 124, the MTJT device 100 is switched to an on state, and the magnetization orientation of the free magnetic layer 108 is perpendicular to the magnetization orientation of the first and second pinned layers such that the resistance of the source-drain region is in a low resistance state as shown in FIG. 4. That is, when a voltage is applied to the gate electrode 124, the insulating barrier layer 122 is used to modify the anisotropy of the free magnetic layer 108 such that when the voltage is applied, the modification of charge and bonding at an interface between the free magnetic layer 108 and the second tunnel barrier layer 114 causes the magnetization of the free magnetic layer 108 to change from in-plane to perpendicular as shown in FIGS. 3 and 4, respectively, and vice versa. Further, the change in magnetization direction with respect to the fixed magnetization directions of the first and second pinned layers 111 and 116 causes a shift in the quantized energy levels in the free magnetic layer 108, thus, changing the resistance of the double MTJ element 110 and modulating the current flowing between the source electrode 102 and the drain electrode 104. Further, a device 100 that is of a normally high resistance switches to a low resistance when a voltage is applied to the gate electrode 124 and a device 100 of a normally low resistance switches to a high resistance when a voltage is applied to the gate electrode 124.

The present invention provides a MTJT device and method for operating the MTJT device that is a three terminal device including an insulating barrier layer formed at a gate region and a double MTJ element within the source-drain region, where the insulating barrier layer is used to modify anisotropy of a free magnetic layer of the double MTJ element. The present invention provides the advantages of switching the MTJT device between an on state and off state using a minimal gate voltage, having a large on/off current ratio and a high on-current.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A magnetic tunnel junction transistor (MTJT) device comprising:
   a source-drain region comprising a source electrode and a drain electrode;
   a double MTJ element formed between the source electrode and the drain electrode and comprising a free magnetic layer at a center region thereof; and
   a gate region adjacent to the source-drain region and comprising an insulating barrier layer formed on an upper layer of the double MTJ element and a gate electrode formed on the barrier layer,
   the magnetic tunnel junction device switching a magnetization orientation of the free magnetic layer by application of a gate voltage to the gate electrode, thereby changing a resistance of the source-drain region.

2. The MTJT device of claim 1, wherein the double MTJ element further comprises:
   a first pinned layer formed on the drain electrode;
   a first tunnel barrier layer formed on the first pinned layer;
   the free magnetic layer formed on the first tunnel barrier layer;
   a second tunnel barrier layer formed on the free magnetic layer; and
   a second pinned layer formed on the second tunnel barrier layer and contacting the source electrode.

3. The MTJT device of claim 2, wherein the MTJT device switches between an on state and an off state based on the gate voltage applied to the gate electrode.

4. The MTJT device of claim 3, wherein the gate voltage ranges between approximately 0 millivolts (mV) to approximately 100 (mV).

5. The MTJT device of claim 3, wherein when the MTJT device is in an off state, the magnetization orientation of the free magnetic layer is in plane with a magnetization orientation of the first and second pinned layers such that a resistance of the source-drain region is in a high resistance state.

6. The MTJT device of claim 5, wherein when the gate voltage is applied to the gate electrode, the MTJT device is switched to an on state, and the magnetization orientation of the free magnetic layer is perpendicular to the magnetization orientation of the first and second pinned layers such that the resistance of the source-drain region is in a low resistance state.

7. The MTJT device of claim 6, wherein the source electrode, the drain electrode and the gate electrode are formed of tantalum.

8. The MTJT device of claim 6, wherein the first and second pinned layers are formed of a magnetic material including at least one of cobalt (Co), or iron (Fe), or any combination thereof.

9. The MTJT device of claim 8, wherein the first and second pinned layers are of a predetermined thickness ranging from approximately 1 nanometers (nm) to approximately 5 nanometers (nm).

10. The MTJT device of claim 6, wherein the free magnetic layer is formed of at least one of cobalt (Co), or iron (Fe), or any combination thereof.

11. The MTJT device of claim 10, wherein the free magnetic layer is of a predetermined thickness ranging from approximately 0.3 nanometers (nm) to approximately 1 nanometer (nm).

12. The MTJT device of claim 6, wherein the insulating barrier layer is formed of a predetermined thickness ranging from approximately 0.5 nanometer (nm) to approximately 2 nanometers (nm).

13. The MTJT device of claim 12, wherein the insulating barrier layer is formed on the second tunnel barrier layer.

14. The MTJT device of claim 13, wherein the insulating barrier layer and the first and second tunnel barrier layers are formed of at least one of magnesium oxide (MgO), aluminum oxide (AlO), or titanium oxide (TiO).

15. The MTJT device of claim 14, wherein the first and second tunnel barrier layers are each formed of a predetermined thickness ranging from approximately 0.5 nanometers (nm) to approximately 2 nanometers (nm).

16. A magnetic tunnel junction transistor (MTJT) device comprising:
   three electrical terminals including a source electrode, and a drain electrode and gate electrode;
   a double MTJ element formed between the source electrode and the drain electrode and comprising a free magnetic layer at a center region thereof; and
   an insulating barrier layer formed on an upper layer of the double MTJ element contacting the gate electrode,
   the magnetic tunnel junction device switching a magnetization orientation of the free magnetic layer by applying a gate voltage to the gate electrode, thereby changing a resistance between the source electrode and the drain electrode.

17. A method for forming a magnetic tunnel junction transistor (MTJT) device, the method comprising:
   forming a source-drain region comprising a source electrode and a drain electrode;

forming a double MTJ element between the source electrode and the drain electrode and comprising a free magnetic layer at a center region thereof; and forming a gate region adjacent to the source-drain region and comprising an insulating barrier layer formed on an upper layer of the double MTJ element and a gate electrode formed on the insulating barrier layer;

wherein a magnetization orientation of the free magnetic layer is switched by application of a gate voltage to the gate electrode, thereby changing a resistance of the source-drain region.

18. The method of claim 17, wherein forming the double MTJ element comprises:

forming a first pinned layer on the drain electrode;

forming a first tunnel barrier layer on the first pinned layer;

forming the free magnetic layer on the first tunnel barrier layer;

forming a second tunnel barrier layer on the free magnetic layer; and forming a second pinned layer on the second tunnel barrier layer and contacting the source electrode.

19. A method for operating a magnetic tunnel junction transistor (MTJT) device having a source electrode, and a drain electrode and gate electrode, a double MTJ element formed between the source electrode and the drain electrode and comprising a free magnetic layer at a center region thereof, and an insulating barrier layer formed on an upper layer of the double MTJ element contacting the gate electrode, the method comprising:

switching a magnetization orientation of the free magnetic layer by application of a gate voltage to the gate electrode, thereby changing a resistance between the source electrode and the drain electrode.

20. The method of claim 19, wherein the MTJT device switches between an on state and an off state based on the gate voltage applied to the gate electrode.

21. The method of claim 20, wherein the gate voltage ranges between approximately 0 millivolts (mV) to approximately 100 (mV).

22. The method of claim 20, wherein when the MTJT device is in an off state, the magnetization orientation of the free magnetic layer is in plane with a magnetization orientation of the first and second pinned layers such that a resistance of the source-drain region is in a high resistance state.

23. The method of claim 22, wherein when the gate voltage is applied to the gate electrode, the MTJT device is switched to an on state, and the magnetization orientation of the free magnetic layer is perpendicular to the magnetization orientation of the first and second pinned layers such that the resistance of the source-drain region is in a low resistance state.

* * * * *